Figure 1:
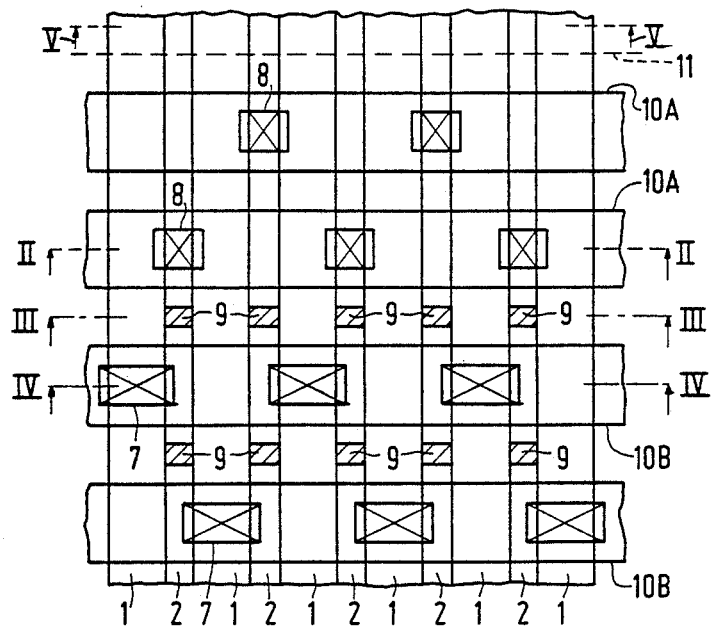

United States Patent [19]

Davids et al.

[11] Patent Number: 4,754,311

[45] Date of Patent: Jun. 28, 1988

[54] SEMICONDUCTOR DEVICE WITH CONTACTS TO PARALLEL ELECTRODE STRIPS

[75] Inventors: Geert J. T. Davids; Anton P. M. Van Arendonk, both of Eindhoven, Netherlands

[73] Assignee: U.S. Philips Corp., New York, N.Y.

[21] Appl. No.: 858,478

[22] Filed: May 1, 1986

[30] Foreign Application Priority Data

May 10, 1985 [NL] Netherlands .................. 8501339

[51] Int. Cl.$^4$ .................. H01L 29/78; H01L 29/34
[52] U.S. Cl. .................. 357/24; 357/54
[58] Field of Search .................. 357/24, 30, 54

[56] References Cited

U.S. PATENT DOCUMENTS

| | | | |
|---|---|---|---|
| 4,163,239 | 7/1979 | Carter | 357/24 LR |
| 4,375,652 | 3/1983 | White | 357/24 LR |
| 4,574,468 | 3/1986 | Slotboom et al. | 357/24 R |
| 4,658,278 | 4/1987 | Elabo et al. | 357/30 R |

Primary Examiner—Gene M. Munson
Attorney, Agent, or Firm—Paul R. Miller

[57] ABSTRACT

A semiconductor device is set forth comprising a number of parallel first electrodes (1) which are located on an insulating layer and are mutually separated by grooves with insulated walls, in which second electrodes (2) coplanar with the first electrodes (1) are provided. According to the invention, the first electrodes (1) are covered by an insulating layer provided with first contact windows (7), which each overlap at least one second electrode (2). The second electrodes (2) are provided with self-aligned second contact windows (8). Each second electrode (2) exhibits between its second contact window (8) and the first contact windows (7) overlapping the second electrode and also between said first contact windows (7), at least one interruption (9).

6 Claims, 2 Drawing Sheets

SEMICONDUCTOR DEVICE WITH CONTACTS TO PARALLEL ELECTRODE STRIPS

The invention relates to a semiconductor device comprising a number of first electrodes which consist of practically parallel electrode strips located on an electrically insulating layer and which are separated from each other by grooves with insulated walls, these grooves being filled with a conductive material constituting intermediate second electrodes which are coplanar with the first electrodes.

The invention further relates to a method of manufacturing such a device.

A semiconductor device of the kind described is known from the Japanese Patent Application No. JP-A-55-8008 laid open to public inspection.

Semiconductor devices having electrode systems of the kind described above are used more particularly, although not exclusively, in charge-coupled semiconductor devices, also designated as CCD's (short for: "Charge-Coupled Devices").

Such electrode systems are used in integrated circuits of high packing density and are consequently preferably constructed so that the electrodes are as narrow as possible and are located as close to each other as possible. In the known structure described, for example, the distance between the "first" and "second" electrodes is determined by the thickness of the oxide wall of the groove between two adjacent "first" electrodes.

However, in order to be able to use such narrow electrodes located very close to each other, it is necessary that they can be contacted. This is generally effected by means of metal tracks, which are in contact with various electrodes via contact windows in an insulating layer present on the electrodes. It is however, practically not possible in the case of such very narrow electrodes to provide the contact windows so that they do not overlap adjacent electrodes.

The present invention has for its object to provide a solution for this problem. It is based inter alia on the recognition of the fact that overlapping contact window masks can be used in such a way that the overlap does not influence the operation of the separate electrodes.

According to the invention, for this purpose a semiconductor device of the kind described in the opening paragraph is characterized in that the first electrodes are covered by a first insulating layer and are contacted via first contact windows, which each overlap at least in part a second electrode, and in that the second electrodes are covered by a second insulating layer which is thinner than said first insulating layer and are contacted via second contact windows which are provided therein and are limited by the insulating layer to adjoining first electrodes, each second electrode exhibiting between its second contact window and the first contact windows on the adjoining first electrodes overlapping it, and also between these first contact windows, at least one interruption.

Due to the interruptions in the "second" electrodes in conjunction with the self-aligned second contact windows, it is avoided that the overlapping first contact windows cause short circuits between the first and second electrodes or between two successive first and second electrodes, respectively, while nevertheless masks having serviceable dimensions larger than the width of the electrodes can be used for forming the contact windows.

The "first" contact windows may overlap one of the adjoining second electrodes and not overlap the other of these electrodes. In most cases, they will overlap both adjoining electrodes.

The invention further relates to a very effective method of manufacturing a semiconductor device of the kind described above. According to the invention, this method is characterized in that a number of parallel strip-shaped first electrodes separated from each other by grooves are provided on an electrically insulating layer, in that these first electrodes and the groove wall are covered with an insulating layer, in that subsequently the entire structure is provided with a conductive layer, which is then etched until parts of these conductive layers are only left within the grooves, these parts forming intermediate second electrodes, in that a number of interruptions are formed in each second electrode by etching and the second electrodes are provided with an insulating layer which is thinner than the insulating layer on the first electrodes, in that via a mask a self-aligned second contact window is formed on each of the second electrodes by etching away the thinner insulating layer, and in that via another mask a first contact window overlapping in part at least one of the adjacent second electrodes is formed on each first electrode by etching away the insulating layer present on the first electrodes, the contact windows being arranged so that each second electrode between every two overlaps and between an overlap and the second contact window exhibits one of said interruptions.

The invention will now be described more fully with reference to an embodiment and the drawing, in which:

FIG. 1 shows diagrammatically in plan view a part of a semiconductor device according to the invention, FIGS. 2 to 5 show diagrammatically cross-sections of FIG. 1 taken on the planes II—II, III—III, IV—IV and V—V; and FIGS. 6 to 10 show diagrammatically cross-sections of the semiconductor device in successive stages of the manufacture.

The Figures are purely schematic and are not drawn to scale; for the sake of clarity, especially the dimensions in the direction of thickness are greatly exaggerated. Corresponding parts are generally designated in the Figures by the same refernce numerals.

FIG. 1 shows in plan view and FIGS. 2, 3, 4 and 5 show diagrammatically in cross-sections taken on the lines II—II, III—III, IV—IV and V—V a part of a semiconductor device according to the invention.

The device comprises a number of first electrodes 1 and a number of second electrodes 2 (cf. FIG. 1). The electrodes 1 consist of practically parallel silicon strips which are located on an insulating layer 3 and are separated from each other by grooves 4 with insulated walls 5. The grooves 4 are filled with silicon which forms the intermediate second electrodes 2, which are coplanar with the first electrodes 1 (cf. FIGS. 2, 4 and 5).

According to the invention, the "first" electrodes 1 are covered by an insulating layer 6 (which layer 6 need not consist on all electrodes 1 of the same material!). Furthermore, the electrodes 1 are contacted via "first" contact windows 7, which each overlap at least one "second" electrode 2 (in this embodiment the two adjoining electrodes 2) (cf. FIGS. 1 and 4). The second electrodes 2 are contacted via "second" contact windows 8, which are bounded by the insulating layers (5, 6) on the adjoining "first" electrodes 1 (cf. FIG. 2) and are therefore self-aligned at least in the lateral direction. In FIG. 1, the regions in which the silicon is exposed within the contact windows are indicated by diagonal lines.

Figure 3:
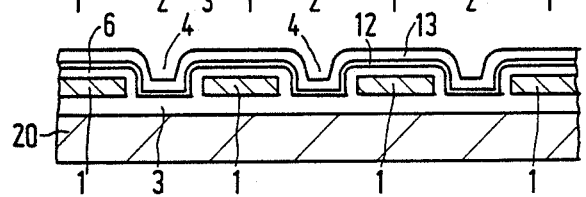

Moreover, according to the invention,, interruptions (cf. FIG. 1) are formed in the second electrodes (2), each second electrode 2 exhibiting at least one interruption 9 between its contact window 8 and the overlapping contact windows 7 on the adjoining "first" electrodes 1 and also between these "first" contact windows 7; see also the cross-section of FIG. 3.

Figure 2:
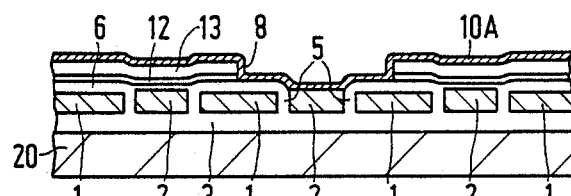
Figure 4:
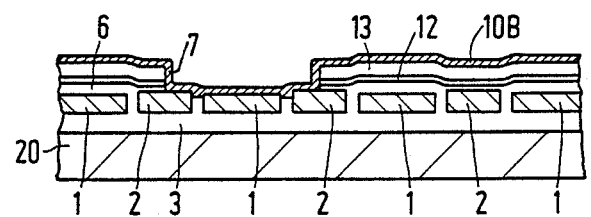

Due to this arrangement of the interruptions in the electrodes 2, it is avoided that via the overlap by the windows 7 a short-circuit occurs between the adjoining electrodes, while each electrode is provided with a single contact window, which forms a connection to metal tracks (10A, 10B), which are connected to the clock voltage source (not shown here); see FIGS. 1, 2 and 4.

Figure 5:
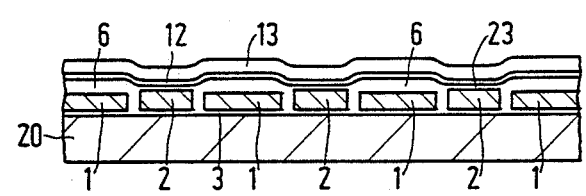
Figure 6:
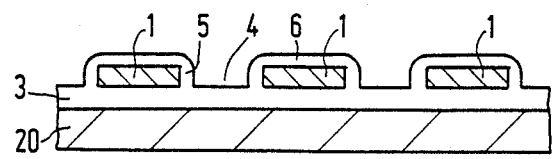
Figure 7:
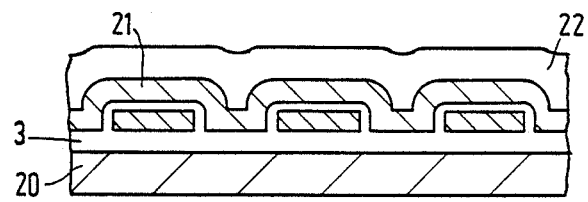

The active part of the device, in this case a charge-coupled semiconductor device or CCD register, is situated in FIG. 1 above the dotted line 11. Of course no interruptions are present in the electrodes 2 between the contact windows 8 and this active region. FIG. 5 shows diagrammatically a cross-section of the active region of the CCD register taken on the line V—V of FIG. 1, in this embodiment the "first" electrodes 1 serving for charge storage and the "second" electrodes 2 axting as transfer electrodes (the inverse could also be the case). The oxide layer 3 is thinner in this active part than in the cross-sections of FIGS. 2, 3 and 4.

In FIGS. 2, 4 and 5, further a silicon nitride layer 12 and a silicon oxide layer 13 are shown; these layers are not essential to the structure, but they are used in the manufacture of the device, which will now be described inter alia with reference to FIGS. 6 to 10.

An insulating layer 3 of, for example, silicon oxide is formed on a p-type conducting silicon substrate having a doping concentartion of, for example, $5 \times 10^{14}$ atoms/cm$^3$ (this may alternatively be an epitaxial layer grown on a substrate). Outside the active region of the device, this may be a countersunk oxide layer (LOCOS) obtained by selective oxidation. On this layer is deposited a silicon layer having a thickness of about 0.5 μm, which is subdivided by etching in a usual manner into strips (1) at a mutual distance of about 2 μm, which strips are then provided with an oxide layer 6, by thermal oxidation for instance. The walls of the grooves 4 mutually separating the silicon strips 1 are then also covered by an oxide layer 5 (cf. FIG. 6).

The entire structure is now covered (cf. FIG. 7) by a second silicon layer 21, also having a thickness of 0.5 μm. On this layer is provided a photoresist layer 22 having a thickness of about 1.3 μm, which is baked out at about 200° C. in order to obtain a photoresist surface as flat as possible. The dislevelling in the ultimate photoresist surface is then about 40 nm. The silicon layers 1 and 21 will generally be polycrystalline or at any rate will not be monocrystalline.

Figure 8:
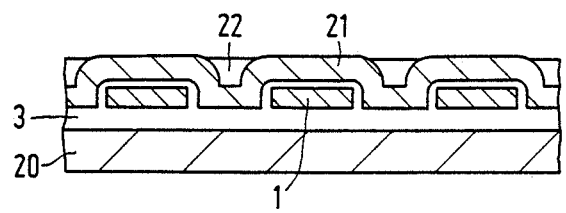

The photoresist layer 22 is then etched until it has fully disappeared on the silicon strips 1. This may be effected, for example, by plasma-etching in a mixture of CF$_4$, CHF$_3$, O$_2$ and Ar. Thus, the situation shown in FIG. 8 is obtained.

Figure 9:
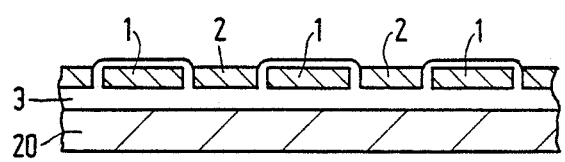
Figure 10:
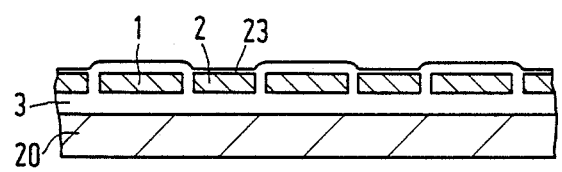

The practically flat overall surface of the silicon layer 21 and of the remaining parts of the photoresist layer 22 is now etched further in a second etching step until ultimately the situation is obtained shown diagrammatically in FIG. 9, only parts 2 of the second silicon layer 21 being left between the insulated silicon strips 1. This second etching step may be carried out, for example, by plasma-etching in a CCl$_4$ plasma at a pressure of about 80 Pa (600 mTorr) at a power of 550 W. Finally, the "second" electrodes 2 thus obtained are provided with a thin oxide layer 23 by a light thermal oxidation (cf. FIG. 10).

The interruptions 9 indicated in FIG. 1 are now etched into the "second" electrodes 2.

The whole is then provided with a layer 12 of silicon nitride, on which is formed a layer 13 of silicon oxide by means of usual techniques, as appears from the cross-section shown in FIG. 5 (because this cross-section is taken through the "active" part of the CCD register, the oxide layer 3 is much thinner here).

Openings are now etched into the composite layer 12+13 for forming the contact windows. By means of a first photoresist mask, openings are formed first in the oxide layer 13 and then in the nitride layer 12 above the second electrodes 2, these openings extending as far as above the first adjoining electrodes 1. Subsequently, the thin oxide 23 on the electrodes 2 is removed by a dip-etching step, the thicker oxide 5, 6 on the electrodes 1 being maintained for the major part. Thus, a self-aligned contact window is formed on the electrodes 2 and this window is bounded by the oxide 5, 6 by means of a mask whose width may be larger than that of the electrodes 2. This situation is shown in FIG. 2, in which the metal track 10A contacting the electrodes 2 is also shown.

By means of another photoresist mask, openings are now formed above the first electrodes 1 in the layers 12 and 13, these openings extending above the adjoining second electrodes 2. After the silicon nitride layer 12 has been etched away, the oxide 6 is etched away from the electrodes 1, the thinner oxide 23 on the adjoining electrodes 2 within the mask opening then of course also disappearing. This situation is shown in FIG. 4, in which the metal track 10B contacting the electordes 1 is also shown.

Although the metal track 10B short-circuits the electrodes 1 and the adjoining electrodes 2 with each other, this does not influence the potentials of the electrodes 1 and 2 within the active region of the semiconductor device, due to the interruptions in the electrodes 2 provided in accordance with the invention. The contact windows on the "first" electrodes 1 can thus also be formed by means of a mask having a width larger than that of these electrodes.

The silicon nitride layer 12 and the oxide layer 13 could be dispensed with, if necessary, by providing the photoresist mask directly on the oxide layers 6 and 23, respectively. Since these oxide layers and more particularly the layer 23 are extremely thin, however, there is a risk of breakdown or short-circuit. This risk is reduced by providing an additional oxide layer 13. The presence of the nitride layer 12 (or another layer than can be selectively etched with respect to silicon oxide) is then desirable as etching stopper during etching of the oxide layer 13. The layers 12, 13 and 23 could be replaced by another combination of oxide and nitride layers. While etching this layer combination from the electrodes (2) to form the contact openings 8 one should leave the insulating layers 5 and 6 substantially intact so that an insulation is left between layers 1 and 10A.

In the description given here, only the electrodes of a charge-coupled device have been disclosed. Such a device comprises further parts, for example source and drain zones and source and drain electrodes; because the structure and the manufacture thereof are not essential to the present invention, they will not be described.

The invention is not limited to the embodiment shown and may also be used in semiconductor devices other than CCD registers, i.e. in all the devices in which a number of adjacent narrow electrode strips are employed. Furthermore, the materials of the insulating layers may differ from the aforementioned materials. The insulating layer 5, 6 may also be made of different materials, for example alternately of silicon oxide and of silicon nitride. The electrodes, instead of silicon, may consist of a metal silicide or, alternately, may comprise a metal.

What is claimed is:

1. A semiconductor device comprising a number of first electrodes which consist of practically parallel electrode strips located on an electrically insulating layer and are separated from each other by grooves with insulated walls, these grooves being filled with a conductive material constituting intermediate second electrodes which are coplanar with the first electrodes, characterized in that the first electrodes are covered by a first insulating layer and are contacted via first contact windows which each overlap in part at least one second electrode, and in that the second electrodes are covered by a second insulating layer which is thinner than said first insulating layer and are contacted via second contact windows which are provided therein and are bounded by the insulating layer on the adjoining first electrodes, each second electrode exhibiting at least one interruption between its second contact window and the first contact windows on the adjoining first electrodes overlapping it, and also between these first contact windows.

2. A semiconductor device as claimed in claim 1, characterized in that the first contact windows overlap the two adjoining second electrodes.

3. A semiconductor device as claimed in claim 1 or 2, characterized in that the first electrodes are covered by silicon oxide.

4. A semiconductor device as claimed in claim 3, characterized in that outside the contact windows the insulating layers present on the electrodes are covered by a layer comprising silicon nitride and a further silicon oxide layer present thereon.

5. A semiconductor device as claimed in claim 1 or 2, characterized in that the first and second electrodes are of silicon and that said second insulating layer is of silicon oxide.

6. A semiconductor device as claimed in claim 3, characterized in that the first and second electrodes are of silicon and that said second insulating layer is of silicon oxide.

* * * * *